(12) United States Patent
Zheng et al.

(10) Patent No.: US 11,228,036 B2
(45) Date of Patent: Jan. 18, 2022

(54) HIGH-PERFORMANCE LITHIUM-CONTAINING ORGANIC SULFUR ELECTRODE MATERIAL AND PREPARATION METHOD OF INTEGRATED FLEXIBLE ELECTRODE

(71) Applicant: UNIVERSITY OF SHANGHAI FOR SCIENCE AND TECHNOLOGY, Shanghai (CN)

(72) Inventors: Shiyou Zheng, Shanghai (CN); Junhe Yang, Shanghai (CN); Fei Dong, Shanghai (CN); Yuepeng Pang, Shanghai (CN)

(73) Assignee: University of Shanghai for Science and Technology, Shanghai (CN)

( * ) Notice: Subject to any disclaimer, the term of this patent is extended or adjusted under 35 U.S.C. 154(b) by 0 days.

(21) Appl. No.: 16/972,592

(22) PCT Filed: Apr. 1, 2020

(86) PCT No.: PCT/CN2020/082850
§ 371 (c)(1),
(2) Date: Dec. 6, 2020

(87) PCT Pub. No.: WO2021/082347
PCT Pub. Date: May 6, 2021

(65) Prior Publication Data
US 2021/0367239 A1      Nov. 25, 2021

(30) Foreign Application Priority Data

Nov. 1, 2019   (CN) .......................... 201911063297.5

(51) Int. Cl.
*H01M 4/60*      (2006.01)
*H01M 4/62*      (2006.01)
(Continued)

(52) U.S. Cl.
CPC ......... *H01M 4/606* (2013.01); *H01M 4/0402* (2013.01); *H01M 4/0471* (2013.01);
(Continued)

(58) Field of Classification Search
CPC .. H01M 4/606; H01M 4/0402; H01M 4/0471; H01M 4/1399; H01M 4/625; H01M 10/052
See application file for complete search history.

(56) References Cited

FOREIGN PATENT DOCUMENTS

| CN | 106450423 A | 2/2017 |
|---|---|---|
| CN | 110148696 A | 8/2019 |

(Continued)

OTHER PUBLICATIONS

International Search Report in PCT/CN2020/082850, issued by ISA, dated Aug. 5, 2020.
(Continued)

*Primary Examiner* — Cynthia K Walls
(74) *Attorney, Agent, or Firm* — Zhu Lehnhoff LLP

(57) ABSTRACT

The present invention provides a high-performance lithium-containing organic sulfur electrode material and a preparation method of an integrated flexible electrode. According to the present invention, 1,3-diisopropenyl benzene with diene bonds and Li2S6 are used as precursors to react to generate the lithium-containing organic sulfide Poly (Li2S6-r-DIB) through an in-situ polymerization method. The synthesized lithium-containing organic sulfide Poly (Li2S6-r-DIB) can be directly attached to a flexible conductive carbon cloth to prepare the integrated flexible electrode due to its good viscosity when heated to a certain temperature. The obtained flexible electrode has the advantages of high capacity, high flexibility, stable structure and the like.

12 Claims, 1 Drawing Sheet

(51) Int. Cl.
H01M 10/052 (2010.01)
H01M 4/04 (2006.01)
H01M 4/1399 (2010.01)

(52) U.S. Cl.
CPC ......... *H01M 4/1399* (2013.01); *H01M 4/625* (2013.01); *H01M 10/052* (2013.01)

(56) References Cited

FOREIGN PATENT DOCUMENTS

| | | |
|---|---|---|
| CN | 110304657 A | 10/2019 |
| CN | 110760063 A | 2/2020 |
| WO | 2013023216 A1 | 2/2013 |

OTHER PUBLICATIONS

Written Opinion of the International Search Report in PCT/CN2020/082850, issued by ISA, dated Aug. 5, 2020.
Enhanced Electrochemical Performance of Lithium-Sulfur Batteries with Surface Copolymerization of Cathode in Journal of the Electrochemical Society, written by Jun Zhang, published Jan. 18, 2019.
Mechanism for the Stable Performance of Sulfur-Copolymer Cathode in Lithium-Sulfur Battery Studied by Solid-State NMR Spectroscopy in Chemistry of Materials, witten by Alexander Hoefling, May 8, 2018.

HIGH-PERFORMANCE LITHIUM-CONTAINING ORGANIC SULFUR ELECTRODE MATERIAL AND PREPARATION METHOD OF INTEGRATED FLEXIBLE ELECTRODE

FIELD OF THE INVENTION

The present invention relates to the technical fields of organic polymer materials and integrated electrode devices, in particular to a high-performance lithium-containing organic sulfur electrode material and a preparation method of an integrated flexible electrode.

BACKGROUND OF THE INVENTION

High capacity, light weight and flexibility are the most important trends of portable electronic products. With the development of the times and society, foldable or bendable portable electronic products will affect or even change the life style of human beings in the near future. Energy storage device is the core component of portable electronic products. The development of energy storage devices with high performance and comprehensive performance such as flexibility and light weight is one of the keys to the wide application of flexible electronic products. Therefore, the development and utilization of energy storage devices with comprehensive performances such as high specific volume, flexibility, lightweight is the key to the wide use of flexible electronic products.

As a new generation of energy storage system, the lithium-sulfur battery has a theoretical specific capacity (1672 mAh g−1) much higher than that of commercial lithium-ion battery, which can meet the energy storage requirements of most electronic devices. Because sulfur is abundant in the earth's crust and is economical, lithium-sulfur batteries have become a particularly attractive and low-cost energy storage technology. Although the sulfur cathode in the lithium-sulfur battery system has the advantages of low cost and environmental friendliness, in long-term research, people have also found some shortcomings in the lithium-sulfur system, which also hinder the commercialization of the lithium-sulfur battery system. During the charge-discharge cycle, the electrochemical process of lithium-sulfur battery is not completed in one step, but involves a series of conversion reactions and the formation of polysulfides ($Li_2S_x$, $2<x\leq 8$), which results in volume expansion of sulfur and shuttle effect. Moreover, sulfur is a poor conductor with lower conductivity. These drawbacks result in a greatly reduced battery cycle life. However, among the above-mentioned drawbacks, the shuttling effect of the lithium sulfur battery is most fatal. During the discharge and charge cycles, long-chain polysulfides (Li2Sx, $4<x\leq 8$) that can be dissolved in the electrolyte are generated in the cathode and move to the anode and react with lithium metal to form short-chain polysulfides that are insoluble in the electrolyte. ($Li_2S_x$, $2<x\leq 4$), and the short-chain polysulfides diffuse back to the cathode to produce long-chain polysulfides again. This process generally results in irreversible loss of active material and low coulombic efficiency, which is a major cause of rapid capacity decay, low energy efficiency, severe self-discharge, and poor cycle stability.

In view of the above-mentioned defects, especially the shuttle effect, researchers at home and abroad mainly study on material modification and chemical polymerization. Firstly, in the aspect of material modification, the shuttle effect of lithium polysulfides can be reduced through physical limitation of nano pores and improvement of chemical affinity of sulfur and a carbon matrix synergistically. For example, yolk-shell structure composite materials for preparing sulfur, polysulfide absorbing materials, and various nanostructured carbon materials are used as sulfur host materials to confine sulfur within their channels, including ordered mesoporous carbon (CMK-3), carbon nanotubes, carbon nanofibers, carbon spheres, graphene, graphene oxide, conductive polymers, etc. Although the heteroatom doping and surface functionalization of carbon materials promote the chemical capture of polysulfides and increase the affinity between the porous matrix and polysulfides, due to the limited surface area and a small number of adsorption sites, the capture efficiency of lithium polysulfides is still not satisfactory. In addition, the large pore size and non-uniform distribution of these functional groups is a major obstacle to the uniform distribution of sulfur and the preferential deposition of solid products on carbon substrates.

Secondly, in the aspect of chemical polymerization, a special organic polymer obtained through polymerization reaction is used as a new sulfur cathode material. The organic polymer is obtained by cross-linking polymerization using a monomer having a plurality of polymerizable free radical groups and a long sulfur chain (a melt-broken sulfur eight-membered ring molecule has a double radical at a temperature of 100° C. to 200° C.). However, the conventional organic sulfur as the cathode material of the lithium sulfur battery still uses the conventional paste mixing and piece coating process, and the capacity loss of the initial cycle of the battery is not well improved.

SUMMARY

The present invention aims to provide a high-performance lithium-containing organic sulfur electrode material and a preparation method of an integrated flexible electrode. The lithium-containing organic sulfide prepared by the present invention exhibits good viscosity when heated, and can be directly adhered to the flexible conductive carbon cloth, so that a flexible organic sulfur cathode can be prepared. On one hand, the method for preparing the electrode by the traditional paste mixing and piece coating process is abandoned, so that the active substance can be directly coated on the carbon cloth without adding a binder and conductive carbon; on the other hand, the lithium-containing organic sulfide prepared by the chemical polymerization method not only fastens sulfur atoms in the crosslinked polymer in the form of chemical bonds, but also introduces lithium ions into the molecule, so that the capacity loss of the initial cycle of the lithium-sulfur battery can be well inhibited.

To achieve the above objective, the technical solution adopted by the present invention is: a method for preparing a high-performance lithium-containing organic sulfur electrode material, which includes: 1) taking $Li_2S$ and sublimed sulfur as raw materials and tetrahydrofuran as a medium, reacting $Li_2S$ and sublimed sulfur in a molar ratio of 1:5 for 24 hours under an inert gas environment of 40-60° C. to obtain a $Li_2S_6$ solution in THF; 2) adding a certain amount of 1,3-diisopropenyl benzene (DIB) into the $Li_2S_6$ solution in THF obtained in step 1, and reacting for 30-60 min at 130-150° C. to cause polymerization to obtain a lithium-containing organic sulfide Poly ($Li_2S_6$-r-DIB); and 3) heating the lithium-containing organic sulfide Poly($Li_2S_6$-r-DIB) solution prepared in step 2 to 70-80° C., and evaporating and separating the THF solvent under vacuum to finally obtain an asphaltic-like black lithium-containing organic sulfide Poly($Li_2S_6$-r-DIB).

In the preparation method of a high-performance lithium-containing organic sulfur electrode material, the concentration of the $Li_2S_6$ solution in THF in step 2 is 160 mg $ml^{-1}$. The mass fraction of 1,3-diisopropenyl benzene is one of 5%, 10%, 15%, 20%, 25%, 30% and 50%, wherein the mass fraction of 1,3-diisopropenyl benzene means that the ratio of the mass of added 1,3-diisopropenyl benzene to the sum of the masses of reactants 1,3-diisopropenyl benzene and $Li_2S_6$ when 1,3-diisopropenyl benzene and $Li_2S_6$ are polymerized to prepare Poly ($Li_2S_6$-r-DIB). For example, when prepared, the mass of added 1,3-diisopropenyl benzene (DIB) can be 42.1 mg, 88.9 mg, 141.2 mg, 200 mg, 266.7 mg, 342.8 mg, and 800 mg when taking 5 ml of the above-mentioned $Li_2S_6$ solution in THF.

A preparation method of an integrated flexible electrode comprises the following steps: heating the black lithium-containing organic sulfide Poly ($Li_2S_6$-r-DIB) obtained by the afore-mentioned preparation method to 50-70° C., and directly and uniformly coating onto a flexible conductive cloth by a coating method to obtain an integrated organic sulfur electrode.

In the preparation method of the integrated flexible electrode provided by the present invention, the conductive cloth is a carbon fiber braid.

The integrated flexible electrode is prepared by adopting the preparation method.

Compared with the prior art, the present invention has the advantages that:

1. The lithium-containing organic sulfide prepared by the present invention not only solves the problem of low inhibition of the shuttle effect of the traditional S/C composite material, but also solves the problem of poor conductivity of the conventional organic sulfur.

2. The integrated electrode designed by the present invention does not need the addition of a binder and additional conductive carbon, and improves the loading amount of sulfur and the volume specific capacity of the battery. The preparation method is simple, and the preparation cost is low.

3. The lithium-containing organic sulfide electrode material and the integrated electrode obtained by the method have the characteristics of good flexibility, high specific capacity and good cycle stability.

DETAILED DESCRIPTION OF THE INVENTION

The technical scheme adopted by the present invention will be further described with reference to the schematic drawings.

Example 1: a high-performance lithium-containing organic sulfur electrode material was prepared by a method including: 1) $Li_2S$ and sublimed sulfur were taken as raw materials and tetrahydrofuran as a medium, and $Li_2S$ and sublimed sulfur were reacted in a molar ratio of 1:5 for 24 hours under an inert gas environment of 40-60° C. to obtain a $Li_2S_6$ solution in THF;

2) a certain amount of 1,3-diisopropenyl benzene (DIB) was added into the $Li_2S_6$ solution in THF prepared in step 1, and a reaction was occurred for 30-60 min at 130-150° C. to cause polymerization to obtain a lithium-containing organic sulfide Poly ($Li_2S_6$-r-DIB), wherein the mass fraction of the DIB can be adjusted arbitrarily within a certain range;

3) the lithium-containing organic sulfide Poly ($Li_2S_6$-r-DIB) solution prepared in step 2 was heated to 70-80° C., and the THF solvent was evaporated and separated under vacuum to finally obtain an asphaltic-like black lithium-containing organic sulfide Poly ($Li_2S_6$-r-DIB), i.e. the high-performance lithium-containing organic sulfur electrode material.

Example 2: an integrated flexible electrode was prepared by a method on the basis of the method of Example 1 and further including:

4) The lithium-containing organic sulfide Poly ($Li_2S_6$-r-DIB) prepared in step 3 of Example 1 was heated to 50-70° C. to exhibit a good adhesion, and it was directly and uniformly coated on a flexible conductive carbon cloth by a coating method to prepare an integrated organic sulfur electrode having excellent flexibility, and the prepared electrode doesn't require the heating of a binder and conductive carbon.

The conductive carbon cloth in this example is one of commercial carbon fiber braids.

The DIB in this example shows different physical and electrochemical properties with different contents of 5%, 10%, 15%, 20%, 25%, 30%, 50%, and one having the best electrical properties is one of them.

The sulfur content of lithium-containing organic sulfide was measured by an elemental analyzer under the model of Vario EL Cube manufactured by a Germany company. The structure characterization through a nuclear magnetic resonance apparatus under the model of AV500 MHz manufactured by Bruker Advance in Germany can prove that the polymerization reaction of $Li_2S_6$ and DIB occurs, and the sulfur atoms are fixed in the polymer in the form of chemical bonds.

Figure 1:
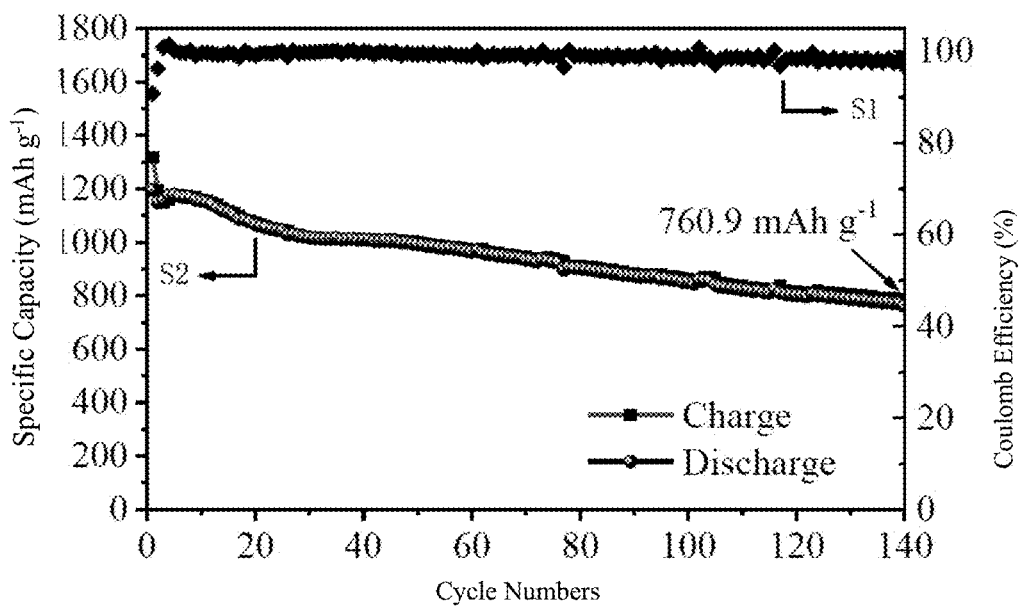
FIG. 1 shows curves of capacity and charge-discharge efficiency of a battery manufactured by using a lithium-containing organic sulfide integrated flexible electrode as a cathode and a pure lithium sheet as an anode according to an embodiment of the present invention.

The electrode material of the example of the present invention was made into a cathode of a lithium battery, which was then used as a test object, and an electrochemical performance test was carried out on the test object by using a multi-channel battery tester under the model of CT2001A manufactured by Wuhan LAND Electronic Co., Ltd; the measured charge-discharge voltage window is 1.5-3 V, the charge-discharge current is 100 mA $g^{-1}$, and the measured capacity and charge-discharge efficiency curves are shown in FIG. 1, wherein the horizontal axis of FIG. 1 is a cycle number axis, the right vertical axis of FIG. 1 is a coulomb efficiency number axis, the left vertical axis of FIG. 1 is a capacity number axis, curve S1 of FIG. 1 is a coulomb efficiency curve, and curve S2 in FIG. 1 is a capacity curve. It can be seen from FIG. 1 that the first discharge capacity of the test object is about 1200 mAh $g^{-1}$. After 140 charge-discharge cycles, the capacity of the test object is stabilized at 760.9 mAh $g^{-1}$, and the coulombic efficiency is always maintained above 97%. Therefore, the test object has high capacity and excellent cycle stability.

Figure 2:
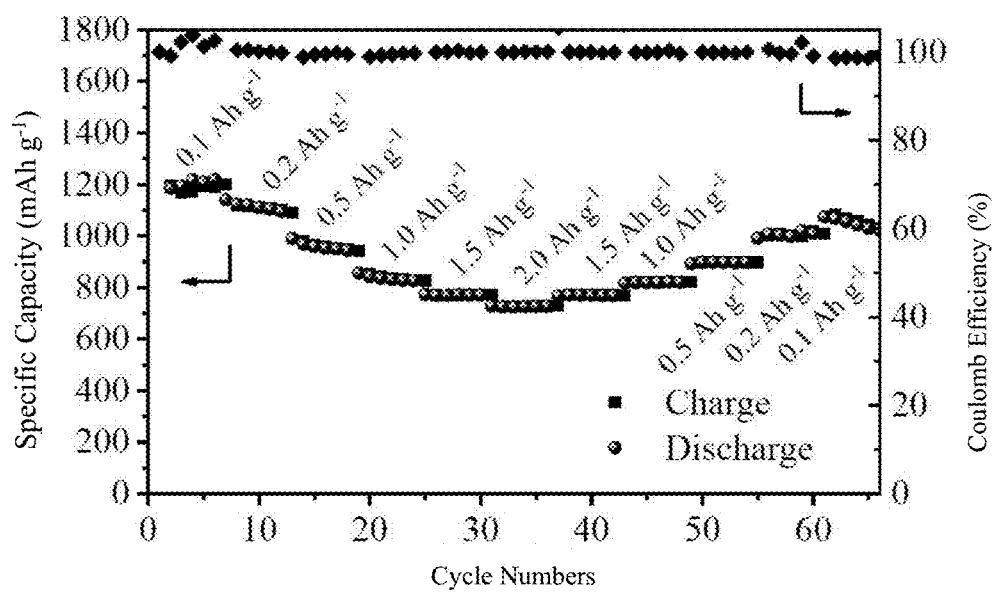
FIG. 2 shows a curve of discharge capacity at charge-discharge current densities of 0.1 A $g^{-1}$ to 2 A $g^{-1}$ of a battery manufactured by using a lithium-containing organic sulfide integrated flexible electrode as a cathode and a pure lithium sheet as an anode according to an embodiment of the present invention.

The electrode material of the example of the present invention was made into a cathode of a lithium battery, which was then used as a test object, and an electrochemical performance test was carried out on the test object by using a multi-channel battery tester under the model of CT2001A manufactured by Wuhan LAND Electronic Co., Ltd; and the measured discharge capacity curve under the charge-discharge current densities of 0.1 A g$^{-1}$-2.0 A g$^{-1}$ is as shown in FIG. 2. It can be seen from FIG. 2 that the test object still has a high capacity at different current densities. The battery still has a capacity of 720 mAh g$^{-1}$ especially at a current density as high as 2.0 A g$^{-1}$, and then the reduced current density can be completely restored to a capacity of about 1100 mAh g$^{-1}$.

In summary, according to the present invention, 1,3-diisopropenyl benzene with diene bonds and $Li_2S_6$ are used as precursors to react to generate the lithium-containing organic sulfide Poly ($Li_2S_6$-r-DIB) through an in-situ polymerization method. The synthesized lithium-containing organic sulfide Poly ($Li_2S_6$-r-DIB) can be directly attached to a flexible conductive carbon cloth to prepare the integrated flexible electrode due to its good viscosity when heated to a certain temperature. The obtained flexible electrode has the advantages of high capacity, high flexibility, stable structure and the like. As the traditional S/C composite material is used as the cathode of the lithium-sulfur battery, a large amount of conductive agent needs to be added, resulting in a low volume specific capacity, and the electrode material through the physical coating will cause the structure to collapse until failure during the charge and discharge cycles; on the other hand, organic sulfur as a cathode material is easily dissolved in an ether electrolyte, so that a part of lithium ions are required to participate in the formation of the SEI film in the initial charge-discharge cycle, resulting a larger initial capacity loss. According to the lithium-containing organic sulfide flexible electrode prepared by the present invention, due to the three-dimensional conductive carbon cloth as a substrate and the rheological property of the material itself, the addition of an additional conductive agent and a bonding agent is not needed, which greatly improves the volume specific capacity of the battery. Meanwhile, due to the introduction of lithium ions, the transmission and migration of lithium ions of the anode are reduced in the initial circulation process, so that the initial cycle capacity can be basically maintained. The lithium-containing organic sulfide electrode material and the integrated electrode obtained by the method have the characteristics of good flexibility, high specific capacity and good cycle stability.

The above are only preferred embodiments of the present invention, and do not play any limiting effect on the present invention. Any person skilled in the art, without departing from the technical solution of the present invention, can make any form of equivalent substitution or modification of the technical solution and the technical content disclosed in the present invention, which still fall within the scope of the present invention without departing from the technical solution of the present invention.

The invention claimed is:

1. A preparation method of a high-performance lithium-containing organic sulfur electrode material, characterized by comprising:
   Step 1, taking $Li_2S$ and sublimed sulfur as raw materials and tetrahydrofuran as a medium, reacting the $Li_2S$ and the sublimed sulfur in a molar ratio of 1:5 for 24 hours under an inert gas environment of 40-60° C. to obtain a $Li_2S_6$ solution in the THF;
   Step 2, adding 1, 3-diisopropenyl benzene (DIB) into the $Li_2S_6$ solution in the THF obtained in step 1, and reacting for 30-60 min at 130-150° C. to cause polymerization to obtain a lithium-containing organic sulfide Poly ($Li_2S_6$-r-DIB); and
   Step 3, heating the lithium-containing organic sulfide Poly ($Li_2S_6$-r-DIB) solution obtained in step 2 to 70-80° C., and evaporating and separating the THF solvent under vacuum to finally obtain an asphaltic-like black lithium-containing organic sulfide Poly ($Li_2S_6$-r-DIB).

2. The preparation method of the high-performance lithium-containing organic sulfur electrode material of claim 1, characterized in that, the mass fraction of 1, 3-diisopropenyl benzene is one of 5%, 10%, 15%, 20%, 25%, 30%, and 50%.

3. A preparation method of an integrated flexible electrode, characterized by comprising: heating the black lithium-containing organic sulfide Poly ($Li_2S_6$-r-DIB) obtained by the preparation method of claim 2 to 50-70° C., and directly and uniformly coating onto a flexible conductive cloth by a coating method to obtain an integrated organic sulfur electrode.

4. The preparation method of the integrated flexible electrode of claim 3, characterized in that the conductive cloth is a carbon fiber braid.

5. An integrated flexible electrode, characterized by being prepared by a preparation method of claim 4.

6. An integrated flexible electrode, characterized by being prepared by a preparation method of claim 3.

7. An integrated flexible electrode, characterized by being prepared by a preparation method of claim 2.

8. An integrated flexible electrode, characterized by being prepared by a preparation method of claim 1.

9. A preparation method of an integrated flexible electrode, characterized by comprising: heating the black lithium-containing organic sulfide Poly ($Li_2S_6$-r-DIB) obtained by the preparation method of claims 1 to 50-70° C., and directly and uniformly coating onto a flexible conductive cloth by a coating method to obtain an integrated organic sulfur electrode.

10. The preparation method of the integrated flexible electrode of claim 9, characterized in that the conductive cloth is a carbon fiber braid.

11. An integrated flexible electrode, characterized by being prepared by a preparation method of claim 10.

12. An integrated flexible electrode, characterized by being prepared by a preparation method of claim 9.

* * * * *